United States Patent [19]

Sun et al.

[11] Patent Number: 5,034,351
[45] Date of Patent: Jul. 23, 1991

[54] PROCESS FOR FORMING A FEATURE ON A SUBSTRATE WITHOUT RECESSING THE SURFACE OF THE SUBSTRATE

[75] Inventors: Shih-Wei Sun; Michael P. Woo, both of Austin, Tex.

[73] Assignee: Motorola, Inc., Schaumburg, Ill.

[21] Appl. No.: 590,856

[22] Filed: Oct. 1, 1990

[51] Int. Cl.$^5$ .................................. H01L 21/465
[52] U.S. Cl. ..................... 437/228; 437/31; 437/41; 437/180; 437/183; 437/186; 437/233; 437/912; 437/913; 148/DIG. 50
[58] Field of Search ............... 437/228, 41, 31, 180, 437/184, 186, 913, 912, 187, 190, 233; 148/DIG. 50

[56] References Cited

U.S. PATENT DOCUMENTS

| | | | |
|---|---|---|---|
| 4,283,483 | 8/1981 | Coane | 437/190 |
| 4,700,462 | 10/1987 | Beaubien et al. | 437/187 |
| 4,818,725 | 4/1989 | Lichtel, Jr. et al. | 148/DIG. 50 |
| 4,927,776 | 5/1990 | Soejima | 437/31 |
| 4,968,646 | 11/1990 | Blanchard et al. | 437/41 |
| 4,975,382 | 12/1990 | Takasugi | 437/41 |
| 4,997,778 | 3/1951 | Sim et al. | 437/41 |

FOREIGN PATENT DOCUMENTS 58-056472 4/1983 Japan ................................ 437/186

OTHER PUBLICATIONS

S. Wolf and R. W. Tauber, *Silicon Processing for the VLSI Era,* Sunset Beach, Calif. 1986, vol. 1–Process Technology, pp. 155–156.

*Primary Examiner*—Brian E. Hearn
*Assistant Examiner*—Kevin M. Picardat
*Attorney, Agent, or Firm*—Robert L. King

[57] ABSTRACT

A process for forming a feature on a substrate without etching into the surface of the substrate and causing recessed regions. A first layer of material is deposited to overlie the substrate and is formed of a different material to the substrate. The first layer is patterned, using conventional photolithography, to form windows in the first layer of material which expose a substrate surface. The etch selectively etches the first layer of material without substantially etching into the substrate material. A second layer of material, which is the same material as the substrate, is deposited to overlie the first layer of material and makes physical contact with the substrate through the windows patterned in the first layer. The second layer is blanket etched so that isolated regions are formed in regions defined by the windows patterned in the first layer.

10 Claims, 3 Drawing Sheets

PROCESS FOR FORMING A FEATURE ON A SUBSTRATE WITHOUT RECESSING THE SURFACE OF THE SUBSTRATE

FIELD OF THE INVENTION

This invention generally relates to a process for forming a feature on a substrate, and more particularly to a lithographic process for forming a feature on a substrate without affecting the surface level of the substrate.

BACKGROUND OF THE INVENTION

A known method for patterning a first layer of a material overlying a second layer of material is photolithography. A common problem occurs in the practice of conventional photolithography when a structure is formed of a first layer of material and overlies a second layer of material having similar etch rates, and only the first layer is desired to be etched. Under these circumstances, overetching of the second layer of the structure is difficult to avoid since there is no selectivity between the first and second layers of material. In other words, if the two materials have the same etch rate, it is difficult to determine the precise moment in time that the pattern in the first material has been completely formed and the etch can be terminated without substantially etching into the surface of the underlying second layer of material. Overetching of the second layer of material causes the exposed surface of the second layer to become recessed into the bulk of the second layer of material. Recession of the surface of the second layer of material occurs in areas unmasked by the pattern formed in the first layer of material.

Photolithography is widely used to pattern a variety of structures and devices comprising both lines (pattern features) and spaces (pattern windows). The problems of surface recession can be found equally among pattern lines and pattern spaces. Topographical recessions, in the surface of certain manufactured structures such as optical masks, can cause serious degradation of performance. For instance, a wide range of semiconductor structures such as bipolar emitters, and buried contacts have recessed regions which can cause surface electrical leakage problems. The leakage problem affects many types of semiconductor devices formed from materials such as silicon, gallium arsenide, and other well known materials in the semiconductor industry.

A method known to overcome the aforementioned disadvantage of conventional photolithography is the method using an etch stop layer. The etch stop layer is a layer of material different from the first and second layers of material and, therefore, has a different etch rate. The etch stop layer is typically deposited over the second layer of material and underlies the first layer to be etched. Consequently, a high selectivity between the etch stop layer and the first layer of material has been provided. A disadvantage of the etch stop layer is that some of the etch stop layer material remains intact under areas masked by the pattern in the first layer. The presence of this material can negate some of the usefulness of the resulting structure.

In the manufacture of modern bipolar transistors and BiCMOS structures, it is common practice to pattern a layer of polysilicon, using conventional methods, to simultaneously form an emitter structure of a bipolar transistor and a gate structure of an MOS transistor. A known disadvantage of polysilicon emitters, formed using conventional photolithographic methods, is the recession of the silicon substrate underlying the polysilicon layer in the extrinsic or intrinsic base region. The recession is caused by overetching the silicon substrate and is due to the problem of overetch previously mentioned. Unfortunately, the recessed silicon surface can adversely affect the electrical performance of semiconductor devices, such as bipolar transistors. The recessive surface in bipolar transistors, for example, can cause excessive, peripheral base current leakage and beta (transistor gain) degradation. In BiCMOS structures, the bipolar transistor exhibits leakage characteristics due to the presence of a recessed silicon surface. The electrical leakage can severely degrade the electrical performance of BiCMOS circuits which are designed to have high performance and low power consumption.

SUMMARY OF THE INVENTION

The invention provides an improved process for forming a feature on a substrate without recessing a surface of a substrate, which overcomes disadvantages of existing processes. In one form, the invention includes the sequential steps of providing a substrate material having a surface. A first layer of material dissimilar from the substrate material is provided overlying the surface of the substrate material. The first layer of material is patterned in accordance with a predetermined pattern to remove portions of the first layer of material without affecting the surface of the substrate material and avoiding recessing the substrate material. A second layer of material is deposited to overlie the first layer of material and makes physical contact with the substrate material at predetermined portions in accordance with the predetermined pattern. The second layer of material is the same material as the substrate material but has either different electrical or physical characteristics than the substrate material.

DESCRIPTION OF A PREFERRED EMBODIMENT

Figure 1A:
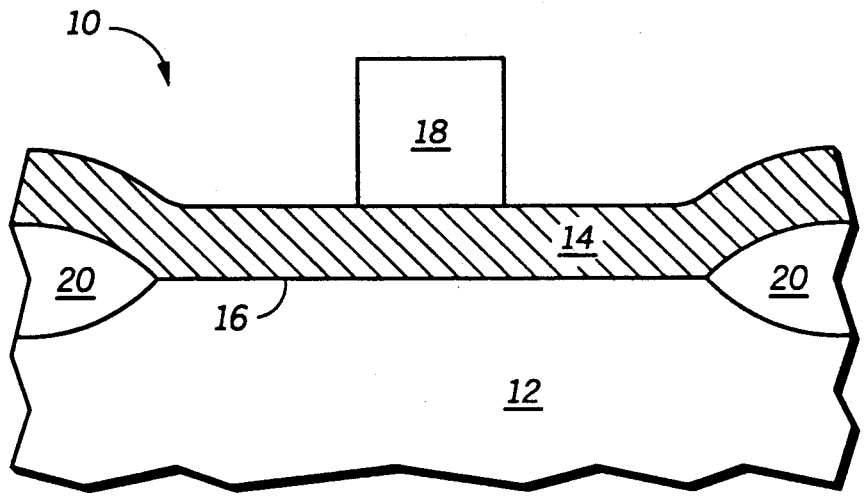
FIGS. 1(A) to 1(C) each illustrate, in cross-sectional form, a known process for forming a feature on a substrate having a recessed surface.

FIG. 1(A) illustrates, in cross-sectional form, a portion of a known recessed feature 10. Recessed feature 10 has a substrate 12, and a first layer 14 which has been deposited to overlie a surface 16 of substrate 12. First layer 14 has been formed of the same material as substrate 12. First layer 14 has been patterned by a photoresist mask to form a predetermined pattern, which has regions of photomasking material, such as a photomask feature 18. In one form, recessed feature 10 is a portion of a semiconductor device having several isolation oxide regions, such as an isolation oxide region 20 and has been formed in a silicon substrate, such as substrate 12. A typical material for forming first layer 14 is polysilicon, which may be deposited using a number of different conventional processes.

Figure 1B:
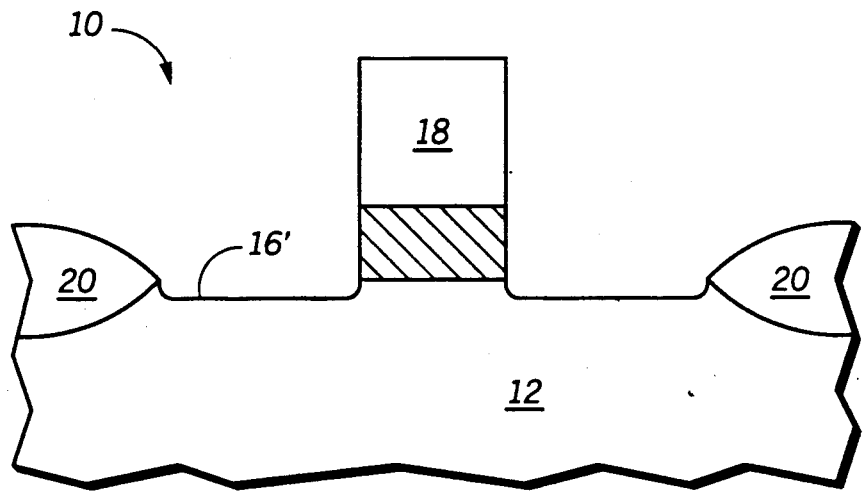

FIG. 1(B) illustrates, in cross-sectional form, further processing of recessed feature 10. Recessed feature 10 has been etched to remove regions of first layer 14, which were unmasked by photomask features, such as photomask feature 18. It should be noted that during the etching operation, the etch has penetrated through first layer 14, in the unmasked areas, and has overetched a surface 16' on substrate 12, which has caused the surface to become recessed into the bulk of substrate 12.

Figure 1C:
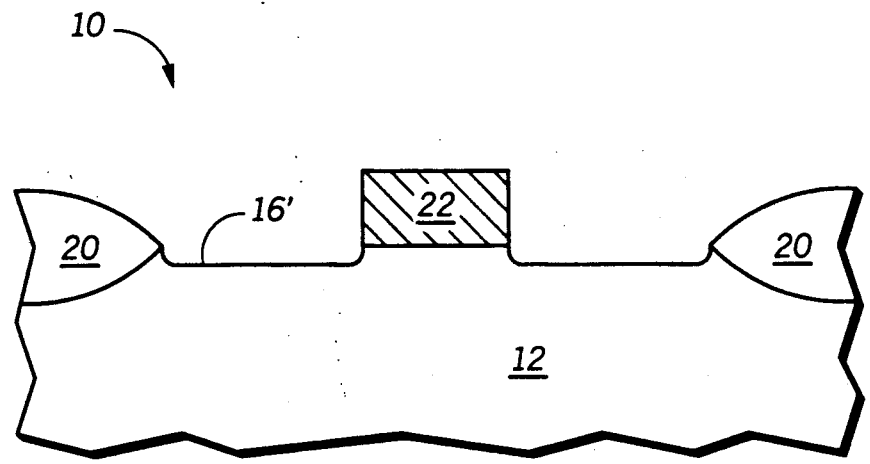

FIG. 1(C) illustrates, in cross-sectional form, further processing of recessed feature 10. Conventional photolithography has been used to form a feature 22 from the first layer of material. In the illustrated form the feature would typically be formed of polysilicon material. Feature 22 is in intimate contact with substrate 12, and is surrounded by recessed surface 16' on the surface of substrate 12. In one form, recessed feature 10 functions as an emitter of a bipolar transistor, in which case feature 22 is typically formed of a doped polysilicon layer and provides a doping source for subsequent emitter junction formation. A disadvantage of the bipolar transistor device formed from recessed feature 10 is excessive peripheral base current leakage and beta (transistor gain) degradation, both of which are attributable to the electrical properties of the recessed surface, such as recessed surface 16'. The recession in the surface of the substrate is caused by the inability to control the endpoint of the etching process at the polysilicon and silicon interface. It should be noted that, although the device described herein has been a semiconductor device, other devices such as optical devices, suffer from similar disadvantages.

Figure 2A:
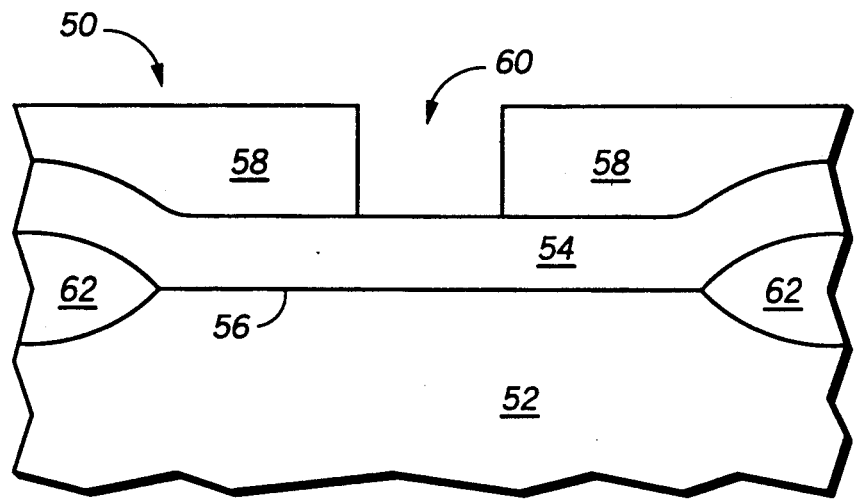
FIGS. 2(A) to (E) illustrate, in cross-sectional form, a process for forming a feature on a substrate in accordance with the present invention.

FIGS. 2(A) to (E) illustrate, in cross-sectional form, process steps of the present invention for forming a feature on a substrate without recessing a surface of the substrate. FIG. 2(A) illustrates, in cross-sectional form, a portion of a non-recessed feature 50, which provides a substrate suitable for one form of the present invention. In the illustrated form, non-recessed feature 50 has a substrate 52 and a first layer 54 which has been deposited to overlie a surface 56 of substrate 52. In one form, substrate 52 is comprised of silicon. First layer 54 is formed of a different material than the substrate. A photomasking layer 58 has been patterned on first layer 54 to form a predetermined pattern of windows, such as a photomask window 60. In the illustrated form, non-recessed feature 50 is a portion of a semiconductor device having several isolation oxide regions, such as an isolation oxide region 62, which is formed in substrate 52. The material for first layer 54 can be an oxide, which may be deposited or grown using conventional processes, or first layer 54 may be another material providing that the selected material does not have the same etch rate as the substrate.

Figure 2B:
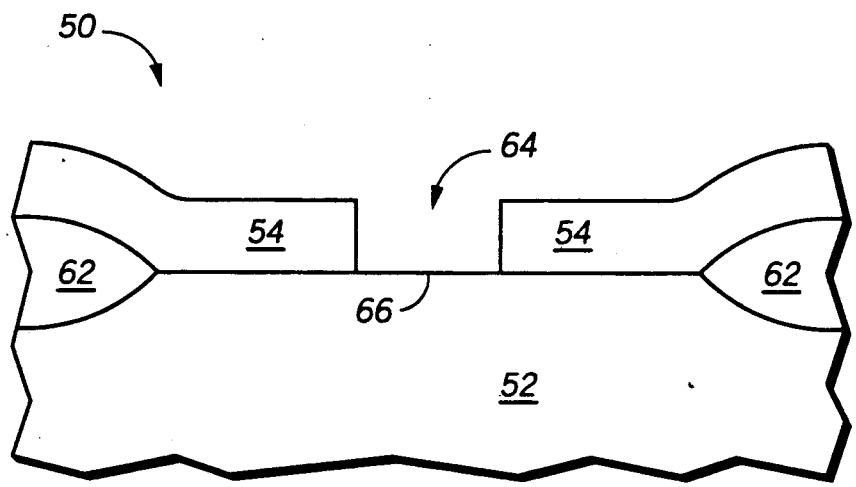

FIG. 2(B) illustrates, in cross-sectional form, further processing of non-recessed feature 50, in accordance with the present invention. Non-recessed feature 50 has been etched by an etch process such as a conventional plasma etch process, having a high selectivity, to form an oxide window 64 which exposes a window surface region 66. A selective etching process implies that the etch has a substantial etch rate difference between the material of first layer 54 and the material of substrate 52. For example, if the etch rate of the first layer 54 is ten times faster than that of the substrate 52, then the substrate 52 will not be substantially recessed after the etch has penetrated through first layer 54. In other words, the substrate 52 is not substantially overetched, and the surface of the substrate is not recessed in substrate 52. In one form, a conventional ($CHF_3 + O_2$) plasma can be used to etch a pattern into first layer 54 which is formed of oxide material, and etched without etching substantially into surface region 66.

Figure 2C:
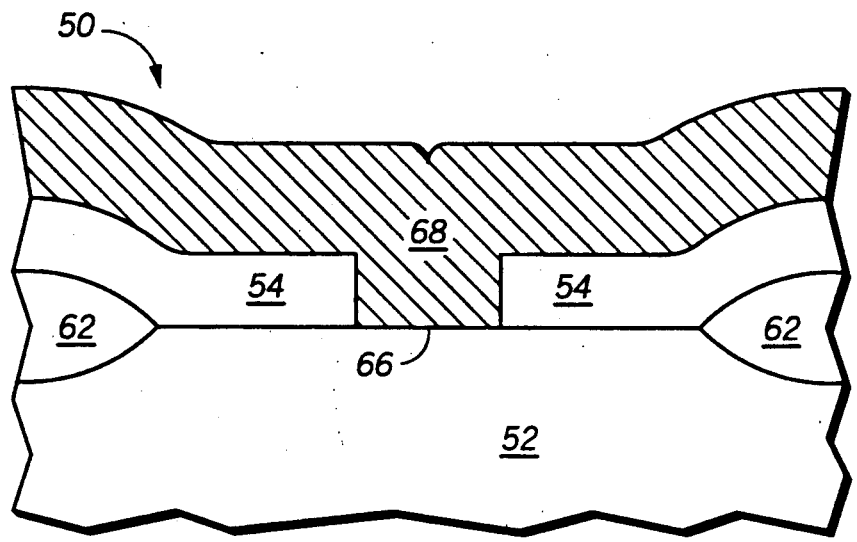

FIG. 2(C) illustrates, in cross-sectional form, further processing of non-recessed feature 50, in accordance with the present invention. Non-recessed feature 50 has a second layer 68, which has been deposited to overlie first layer 54. Second layer 68 is in intimate contact with the exposed window surface region 66. In one form, non-recessed feature 50 is suitable for forming a portion of a bipolar transistor, which has second layer 68 formed of a polysilicon layer.

Figure 2D:
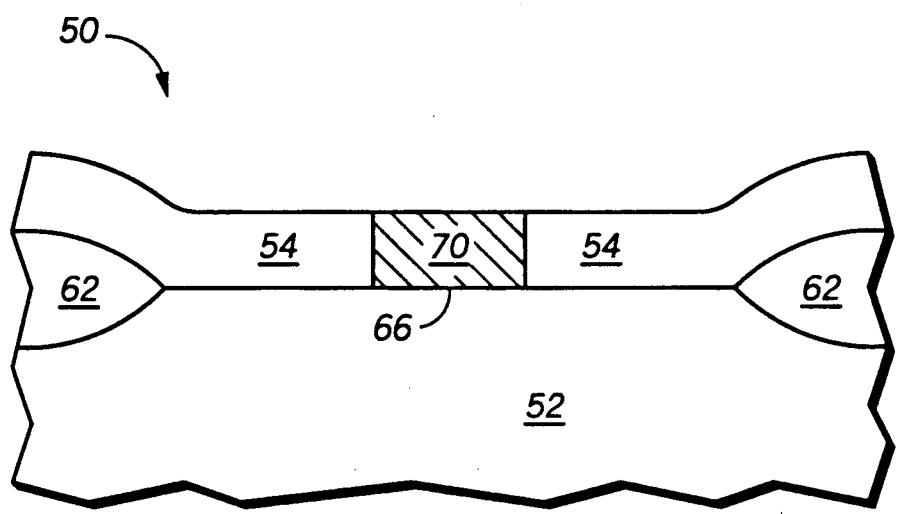

FIG. 2(D) illustrates, in cross-sectional form, further processing of non-recessed feature 50, in accordance with one embodiment of the present invention. The second layer 68 has been etched back using a conventional blanket etch process to reduce the thickness of second layer 68. The etched back surface of second layer 68 has become planar with the surface of first layer 54, so that a remnant of second layer 68, as a result of the etch, has become localized to the area of window surface region 66. This has occurred because the thickness of second layer 68 within the patterned window is much greater than the original film thickness of second layer 68. In this manner, the method of the present invention has patterned the second layer to form features, such as a feature 70, without recessing the surface of the silicon substrate. In one form, non-recessed feature 50 can be incorporated into a final structure, such as a bipolar transistor. Alternatively, the remaining material of first layer 54 can be removed and other layers of material can be deposited to overlie feature 70. In another form, a selective deposition process can be used to form feature 70, without having to form and etch back the second layer 68 as shown in FIGS. 2(C) and 2(D).

Figure 2E:
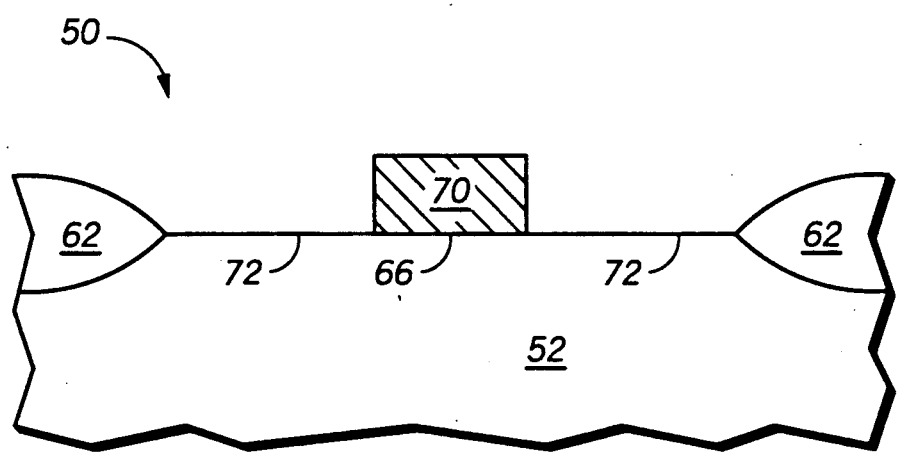

FIG. 2(E) illustrates, in cross-sectional form, further processing of non-recessed feature 50, in accordance with one embodiment of the present invention. In one form, it has been expedient to etch away the remaining portions of first layer 54. Non-recessed feature 50 has had first layer 54 removed in a conventional wet chemical etch, such as a buffered HF solution, which has sufficient selectivity to avoid the recession of the surrounding substrate surface, such as a non-recessed substrate surface 72. The present invention has now provided a structure, such as non-recessed feature 50, which has overcome the disadvantages of the conventional photolithographic method described previously. The recession of the surface of substrate 52 in areas surrounding feature 70 has been avoided. The use of different materials, in the practice of the present invention, has provided an adequate etch selectivity between the first layer 54 and the substrate 52 so that the substrate is not overetched.

The method of the present invention can also be used to overcome similar problems encountered with conventional photolithographic processes, when used for the fabrication of a BiCMOS structure. A BiCMOS substrate material may be provided by epitaxially growing silicon on single crystalline silicon. The BiCMOS structure has both a bipolar transistor emitter and an MOS transistor gate. A disadvantage of the previously described conventional photolithographic method which is used to fabricate BiCMOS structures is the recession of the silicon surface surrounding emitter regions of the bipolar device. Disadvantages of the recessed surface surrounding the emitter are an enhanced, peripheral component of base current, and degraded, uncontrollable bipolar current gain. A disadvantage of silicon substrate damage is poor reliability, electrical leakage, and hot carrier injection.

A further advantage of the present invention is the ability of the process to overcome certain disadvantages associated with the formation of integrated circuit contacts, such as buried contacts. The conventional method of manufacturing buried contacts usually involves etching a layer of polysilicon which overlies a silicon substrate. Consequently, any overetch of the polysilicon layer generally causes the surface of the silicon substrate to become pitted, and recessed into the bulk of the silicon substrate, which can cause electrical leakage.

By now it should be apparent that there has been provided a process for forming a feature on a substrate without recessing the surface of the substrate, which overcomes the problems of conventional photolithographic methods. In addition to the advantages of avoiding recessed silicon substrate surfaces on bipolar transistors and BiCMOS structures, similar advantages are achieved when the present invention is used in the formation of conventional buried contacts.

While there have been described herein the principles of the invention, it is to be clearly understood by those skilled in the art that this description is made only by way of example, and not as a limitation to the scope of the invention. For example, other devices which are not semiconductor devices and structures can be formed, such as optical filters and gratings, without damaging the underlying substrate. Any other feature which is patterned with fine lines and spaces may benefit from the advantages of the present invention. Other materials can be used, such as gallium arsenide substrates, silicon nitride layers, and metallic layers. Accordingly, it is intended, by the appended claims, to cover all modifications of the invention which fall within the true spirit and scope of the invention.

What is claimed is:

1. A process for forming a feature of same material as a substrate material directly on a surface of the substrate material without recessing the surface of the substrate material, comprising the sequential steps of:

providing a predetermined semiconductor material as the substrate material, the substrate material having a first etch rate when exposed to an etchant;

providing a first layer of material dissimilar from the substrate material overlying the surface of the substrate material, the first layer of material having a second etch rate when exposed to an etchant which is substantially faster than the first etch rate;

patterning the first layer of material in accordance with a predetermined pattern to remove portions of the first layer of material by etching the portions of the first layer of material at the second etch rate without affecting the surface of the substrate material and avoiding recessing the substrate material since the first etch rate is much slower than the second etch rate;

depositing a second layer of material overlying the first layer of material and making physical contact with the substrate material at predetermined portions in accordance with the predetermined pattern, the second layer of material functioning as the feature and being a same type of semiconductor material as the substrate material but having different electrical and physical characteristics than the substrate material; and removing all remaining portions of the first layer of material to complete formation of the feature of the same type of material without having to etch the second layer of material selective to the substrate material at any time during the process, the feature functioning as a single structural element of a bipolar transistor.

2. The process of claim 1 further comprising the step of:

prior to removing all remaining portions of the first layer of material, etching any portion of the second layer of material overlying the first layer of material to substantially planarize a top surface of the first and second layers of material.

3. The process of claim 1 further comprising the step of:

implanting and activating the second layer of material with a dopant material of predetermined conductivity while the first layer of material blocks the dopant material from the substrate.

4. The process of claim 1 further comprising the step of:

performing further processing to fabricate a semiconductor feature by using any remaining portion of the second layer of material substantially without recessing the surface of the semiconductor device substrate.

5. The process of claim 1 wherein said step of depositing a second layer of material comprises a selective deposition.

6. The process of claim 1 wherein said step of depositing a second layer of material comprises a blanket deposition and an etch-back process.

7. The process of claim 1 wherein the second etch rate is substantially ten times faster than the first etch rate.

8. A process for forming a feature of a same material as a substrate material directly on a surface of the substrate material without recessing the surface of the substrate material, comprising the sequential steps of:

providing a BiCMOS semiconductor substrate material as a substrate, the BiCMOS semiconductor substrate material having a surface and a first region for CMOS processing and a second region for bipolar processing, the layer of material having a first etch rate when exposed to an etchant;

providing a first layer of material dissimilar from the BiCMOS semiconductor substrate material and overlying the surface of the BiCMOS semiconductor substrate material, the second layer of material having a second etch rate substantially faster than the first etch rate;

patterning the first layer of material in accordance with a predetermined pattern to remove portions of the first layer of material overlying the second region of the BiCMOS semiconductor substrate material without affecting the surface of the second region of the BiCMOS semiconductor substrate material since the first etch rate is much slower than the second etch rate and avoiding recessing the second region of the BiCMOS semiconductor substrate material;

depositing a second layer of material overlying the first layer of material and making physical contact with the second region of the BiCMOS semiconductor substrate material at predetermined portions in accordance with the predetermined pattern, the second layer of material functioning as the feature and being a same type of semiconductor material as the BiCMOS semiconductor substrate material but having different electrical and physical characteristics than the BiCMOS semiconductor substrate material;

removing all remaining portions of the first layer of material by etching the remaining portions of the first layer of material at the second etch rate and without recessing the BiCMOS semiconductor substrate material since the first etch rate is much slower than the second etch rate to form at least one region of the second layer of material as the feature, the feature being formed without etching the second layer of material selective to the substrate material at any time during the process and functioning as a single structural element of a bipolar semiconductor device; and performing further processing steps to fabricate both an MOS semiconductor device and the bipolar semiconductor device, by using any remaining portion of the second layer of material substantially without recessing the surface of the semiconductor device substrate.

9. The process of claim 8 wherein the step of depositing the second layer of material further comprises depositing a layer of posilicon.

10. A process for forming a feature directly on a surface of a substrate material without inadvertently etching into the surface of the substrate material, comprising the sequential steps of:

providing a silicon substrate having a first etch rate when exposed to an etchant;

providing a first layer of material dissimilar from silicon and overlying a surface of the silicon substrate, the first layer of material having a second etch rate substantially faster than the first etch rate when exposed to the etchant;

patterning the first layer of material in accordance with a predetermined pattern to remove portions of the first layer of material by etching the first layer at the second etch rate and without affecting the surface of the silicon substrate which etches at the first etch rate and avoiding recessing the silicon substrate;

depositing a second layer of material overlying the first layer of material and making physical contact with the silicon substrate at predetermined portions in accordance with the predetermined pattern, the second layer of material functioning as the feature and being polysilicon but having different electrical characteristics than the silicon substrate; and removing portions of the first layer of material adjacent the feature, the feature functioning as a single structural element of a bipolar transistor and having been formed without etching the polysilicon second layer of material selective to the silicon substrate.

* * * * *